United States Patent
Choi

(10) Patent No.: US 6,833,230 B2
(45) Date of Patent: Dec. 21, 2004

(54) PHOTOSENSITIVE POLYMERS CONTAINING ADAMANTYLALKYL VINYL ETHER, AND RESIST COMPOSITIONS INCLUDING THE SAME

(75) Inventor: Sang-jun Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 76 days.

(21) Appl. No.: 10/392,931

(22) Filed: Mar. 21, 2003

(65) Prior Publication Data

US 2003/0194643 A1 Oct. 16, 2003

Related U.S. Application Data

(63) Continuation-in-part of application No. 09/764,150, filed on Jan. 19, 2001, now Pat. No. 6,673,513, which is a continuation-in-part of application No. 09/576,053, filed on May 23, 2000, now Pat. No. 6,517,990.
(60) Provisional application No. 60/198,761, filed on Apr. 21, 2000.

(30) Foreign Application Priority Data

| Jan. 19, 2000 | (JP) | 2000-0034998 |
| Apr. 19, 2000 | (JP) | 2000-20603 |
| Jun. 21, 2002 | (JP) | 2002-34998 |

(51) Int. Cl.$^7$ ............................................. G03F 7/004
(52) U.S. Cl. .................. 430/270.1; 430/910; 526/271; 526/282; 526/319; 526/332
(58) Field of Search .................. 430/270.1, 910; 526/282, 319, 271, 332

(56) References Cited

U.S. PATENT DOCUMENTS

| 3,557,067 A | 1/1971 | Burns et al. |
| 3,844,787 A | 10/1974 | Ulrich et al. |
| 3,887,369 A | 6/1975 | Matsuno et al. |
| 4,370,454 A | 1/1983 | Messmer et al. |
| 4,617,085 A | 10/1986 | Cole, Jr. et al. |
| 4,914,167 A | 4/1990 | Hambrecht et al. |
| 5,008,355 A | 4/1991 | Tazi et al. |
| 5,541,031 A | 7/1996 | Yamashita et al. |
| 6,033,442 A | 3/2000 | Denzinger et al. |
| 6,090,518 A | 7/2000 | Niinomi et al. |
| 6,306,554 B1 | 10/2001 | Barclay et al. |
| 2003/0130409 A1 * | 7/2003 | Kaneko et al. ............ 524/544 |

FOREIGN PATENT DOCUMENTS

| EP | 0836 119 A1 | 4/1998 |
| EP | 0 921 439 A1 | 6/1999 |
| GB | 1408327 | 1/1973 |
| JP | 2000-72982 | 3/2000 |
| WO | WO 98/58988 | 12/1998 |

OTHER PUBLICATIONS

Chemical Abstracts, vol. 118, No. 19, May 10, 1993, Columbus, OH, US; abstract No. 182870, M.J. Han et al., "Synthesis, characterization, and biological activity of polyanion-cis-diammineplatinum(II) complexes as antitumor agents" XP002166124 *abstract* & J. Bioact. Compat. Polym., vol. 7, No. 4, 1992, pp. 358–369.
Chemical Abstracts, vol. 73, No. 10, Sep. 7, 1970 Columbus, Ohio, US; abstract No. 46154, B. Kamo et al., "Copolymerization of 2,3–dihydrofuran" XP002166125 *abstract* & Kogyo Kagaku Zasshi, vol. 73, No. 3,—1970 pp. 580–586.
Chemical Abstracts vol. 76, No. 16, Apr. 17, 1972, Columbus, Ohio, US; abstract No. 86402, A.R.M. Gibb: "Copolymers of alpha, beta–unsaturated carbosylic acid anhydrides" XP002166123 *abstract* & ZA 6 804 466 A 12.
Japanese website English translation of JP 2000–72982, Mar. 2000, www.ipdl.jpo.go.jp/homepg_e.ipdl.

* cited by examiner

Primary Examiner—Rosemary Ashton
(74) Attorney, Agent, or Firm—Volentine Francos & Whitt, PLLC

(57) ABSTRACT

A photosensitive polymer includes a copolymer containing adamantylalkyl vinyl ether, and a resist composition includes the photosensitive polymer. For example, the photosensitive polymer may include a copolymer having a formula:

wherein x is an integer between 1 and 4 inclusive, $R_1$ is a hydrogen atom or a methyl group, $R_2$ is an acid-labile $C_4$ to $C_{20}$ hydrocarbon group, $p/(p+q+r)=0.1$ to 0.4, $q/(p+q+r)=0.1$ to 0.5, and $r/(p+q+r)=0.1$ to 0.4.

44 Claims, No Drawings

PHOTOSENSITIVE POLYMERS CONTAINING ADAMANTYLALKYL VINYL ETHER, AND RESIST COMPOSITIONS INCLUDING THE SAME

CROSS-REFERENCE TO RELATED APPLICATIONS

This is a continuation-in-part of and claims priority to U.S. non-provisional patent application No. 09/764,150 (the '150 application), filed Jan. 19, 2001, now U.S. Pat. No. 6,673,513 which is incorporated herein by reference for all purposes. In addition, a claim of priority is made to Korean patent application No. 2002-34998, filed on Jun. 21, 2002, which is incorporated herein by reference for all purposes.

The '150 application is a continuation-in-part of U.S. non-provisional application No. 09/576,053, filed May 23, 2000, now U.S. Pat. No. 6,517,990. In addition, the '150 application makes a claim of priority to U.S. provisional application No. 60/198,761, filed Apr. 21, 2000; Korean patent application No. 00-2489, filed Jan. 19, 2000; and Korean patent application No. 00-20603, filed Apr. 19, 2000.

BACKGROUND OF THE INVENTION

1. Field of the Invention

The present invention relates to photosensitive polymers and to chemically amplified resist compositions. More particularly, the present invention relates to photosensitive polymers which includes a copolymer containing adamantylalkyl vinyl ether, and to resist compositions which include the photosensitive polymer.

2. Description of the Related Art

As semiconductor devices become highly integrated, photolithography processes used in the manufacture of such devices must be capable of forming fine patterns. For example, 0.2 μm or smaller sized patterns are needed for semiconductor memory devices having capacities exceeding 1 Gbit. Accordingly, conventional resist materials have limited applicability since they are utilized in conjunction with krypton flouride (KrF) excimer lasers having wavelengths (248 nm) which are too large for use in the formation of ultra-fine patterns. Thus, new resist materials have been proposed for use in conjunction with an argon flouride (ArF) excimer laser. This is because the ArF excimer laser has a wavelength (193 nm) which is smaller than that of the KrF excimer laser.

Present resist materials designed for use with ArF excimer lasers suffer several drawbacks as compared with conventional resist materials. The most common of these problems are low transmittance and poor resistance to dry etching.

Acryl- or methacryl-based polymers are generally used and known as ArF resist materials. Representative examples of such polymers include poly(methacrylate)-based polymer materials. However, such polymers exhibit, amount other potential drawbacks, a poor resistance to dry etching. The selectivity of these materials is generally too low to perform a dry etching process using a plasma gas.

Accordingly, in an effort to enhance dry etching resistance, alicyclic compounds having a strong resistance to dry etching, for example, an isobornyl, adamantyl or tricyclodecanyl group, may be introduced into the backbone of a polymer. However, since only a small portion of the polymer is occupied by the alicyclic compound, resistance to dry etching is still weak. Also, since the alicyclic compounds are hydrophobic, if such an alicyclic compound is contained in a polymer, adhesion to materials underlying a resist layer obtained from the polymer may deteriorate.

As another conventional polymer, a cycloolefin-maleic anhydride (COMA) alternating polymer has been suggested. While the fabrication cost associated with raw materials needed to prepare a copolymer such as the COMA system is low, the yield of the polymer is noticeably reduced. Also, the transmittance of the polymer at short wavelengths, for example, 193 nm, is very low. Further, since such polymers have an alicyclic group in their backbone which is strongly hydrophobic, they have poor adhesion characteristics.

Also, due to the structural characteristics of the backbone, these polymers have a high glass transition temperature of about 200° C. or higher. As a result, it is difficult to carry out an annealing process to remove a free volume present in a resist layer obtained from such polymers. Thus, the resist layer is susceptible to an ambient environment. For example, the resist pattern may suffer a T-top profile. Also, in post-exposure delay (PED), the resist layer exhibits a decrease in stability to an ambient atmosphere, which entails many problems in a variety of processes using the resist layer.

SUMMARY OF THE INVENTION

The present invention provides a photosensitive polymer which exhibits favorable adhesion to underlying layer materials and favorable resistance to dry etching, and which is relatively inexpensive to fabricate.

The present invention also provides a resist composition which exhibits favorable lithographic characteristics when conducting a photolithography process using a light exposure source at a short-wavelength region, e.g., 193 nm, as well as a deep UV region, e.g., 248 nm.

According to an aspect of the present invention, there is provided a photosensitive polymer comprising a copolymer having a formula 1:

Formula 1

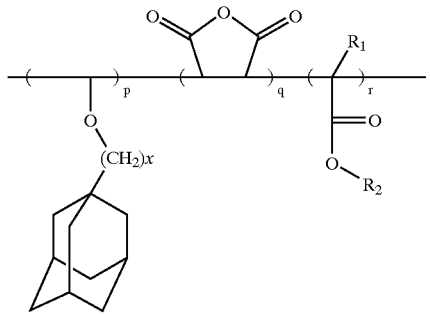

wherein x is an integer between 1 and 4 inclusive, $R_1$ is a hydrogen atom or a methyl group, $R_2$ is an acid-labile $C_4$ to $C_{20}$ hydrocarbon group, $p/(p+q+r)=0.1$ to 0.4, $q/(p+q+r)=0.1$ to 0.5, and $r/(p+q+r)=0.1$ to 0.4. The photosensitive polymer has a weight average molecular weight of 3,000 to 50,000.

Preferably, $R_2$ is a t-butyl, tetrahydropyranyl or 1-ethoxyethyl group. Also, $R_2$ may be an alicyclic hydrocarbon group, exemplified by a 2-methyl-2-norbornyl, 2-ethyl-2-norbonyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 2-propyl-2-adamantyl, 2-methyl-2-fenchyl or 2-ethyl-2-fenchyl group.

According to another aspect of the present invention, there is provided a photosensitive polymer comprising a copolymer having a formula 2:

Formula 2

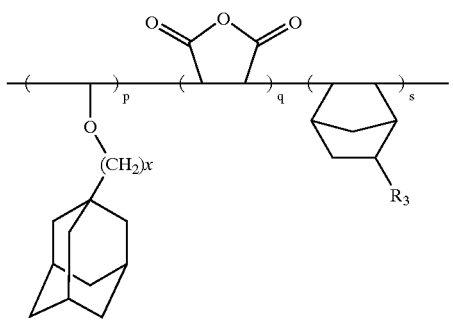

wherein x is an integer between 1 and 4 inclusive, $R_3$ is a hydrogen atom, or a hydroxy, carboxyl, halide, nitrile, alkyl, alkoxy, sulfonate or acid-labile $C_4$ to $C_{20}$ ester group, $p/(p+q+s)=0.1$ to 0.4, $q/(p+q+s)=0.3$ to 0.5, and $s/(p+q+s)=0.2$ to 0.5. The photosensitive polymer has a weight average molecular weight of 3,000 to 30,000.

Preferably, $R_3$ is a t-butyl ester, tetrahydropyranyl ester or 1-ethoxyethyl ester group. Also, $R_3$ may be an 2-methyl-2-norbornyl ester, 2-ethyl-2-norbonyl ester, 2-methyl-2-isobornyl ester, 2-ethyl-2-isobornyl ester, 8-methyl-8-tricyclo[5.2.1.0$^{2,6}$]decanyl ester, 8-ethyl-8-tricyclo[5.2.1.0$^{2,6}$]decanyl ester, 2-methyl-2-adamantyl ester, 2-ethyl-2-adamantyl ester, 2-propyl-2-adamantyl ester, 2-methyl-2-fenchyl ester or 2-ethyl-2-fenchyl ester group.

According to yet another aspect of the present invention, there is provided a photosensitive polymer comprising a copolymer having a formula 3:

Formula 3

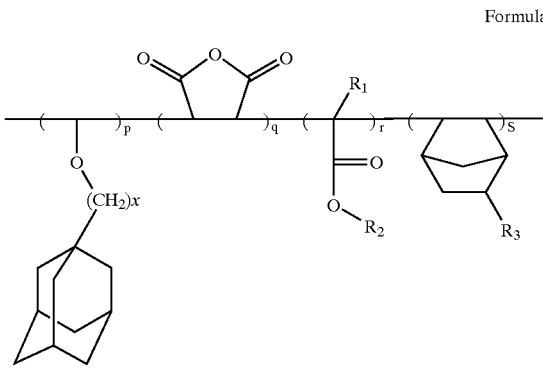

wherein x is an integer between 1 and 4 inclusive, $R_1$ is a hydrogen atom or a methyl group, $R_2$ is a $C_4$ to $C_{20}$ hydrocarbon group, $R_3$ is a hydrogen atom, or a hydroxy, carboxyl, halide, nitrile, alkyl, alkoxy, sulfonate or $C_4$ to $C_{20}$ ester group, at least one of $R_2$ and $R_3$ is an acid-labile group, $p/(p+q+r+s)=0.1$ to 0.3, $q/(p+q+r+s)=0.2$ to 0.5, $r/(p+q+r+s)=0.1$ to 0.4, and $s/(p+q+r+s)=0.1$ to 0.3. The photosensitive polymer has a weight average molecular weight of 3,000 to 30,000.

According to still another aspect of the present invention, there is provided a resist composition comprising a photosensitive polymer having the above formula 1, 2 or 3, and a photoacid generator (PAG).

The PAG is preferably contained in an amount of about 1.0–15 wt % based on the total weight of the photosensitive polymer. Preferably, the PAG comprises triarylsulfonium salts, diaryliodonium salts, sulfonates or a mixture of at least two of these compounds.

The resist composition according to embodiments of the present invention may further include an organic base. The organic base may be contained in an amount of about 0.01–2.0 wt % based on the amount of the PAG. Examples of the organic base include triethylamine, triisobutylamine, triisooctylamine, triisodecylamine, triethanolamine, and mixtures of at least two of these compounds.

The photosensitive polymer according to embodiments of the present invention is obtained from a copolymer of an adamantylalkyl vinyl ether monomer and maleic anhydride, providing good adhesion to underlying layer materials and high resistance to dry etching. Also, the backbone of the photosensitive polymer is more flexible than a conventional backbone, contributing to a lowering of a glass transition temperature of the photosensitive polymer. Therefore, the resist composition obtained therefrom exhibits favorable lithographic characteristics when used in photolithography processes.

DETAILED DESCRIPTION OF THE PREFERRED EMBODIMENTS

Non-limiting exemplary embodiments of the present invention are described in detail below.

EXAMPLE 1

Synthesis of 1-adamantylethyl Vinyl Ether

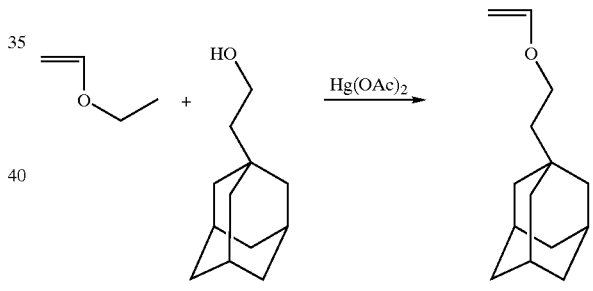

36 g (0.2 mol) of 1-admantaneethanol and 72 g (1.0 mol) ethyl vinyl ether were put into a round bottom flask to be dissolved in 100 mL tetrahydrofuran (THF), followed by adding 5 mol % of mercury acetate. Thereafter, the reaction product was reacted for approximately 12 hours under a reflux condition.

After the reaction was completed, the resulting product was subjected to vacuum distillation to give a desired monomer with a yield of 50%.

EXAMPLE 2

Synthesis of 1-adamantylmethyl vinyl ether

The same procedure as in Example 1 was carried out except that 1-admantanemethanol was used instead of 1-adamantaneethanol, to give a desired monomer with a yield of 40%.

EXAMPLE 3

Synthesis of Photosensitive Polymer

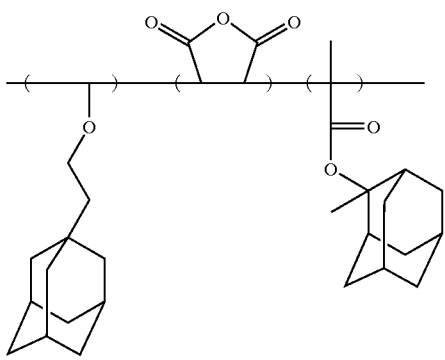

2.0 g (10 mmol) of the monomer synthesized in Example 1, 1.0 g (10 mmol) of maleic anhydride, 2.4 g (10 mmol) of 2-methyl-2-adamantyl methacrylate and 0.15 g (3 mol %) azobisisobutyronitrile (AIBN) were dissolved in 10 g of THF, and purged using a nitrogen gas. Thereafter, the resulting product was polymerized at approximately 65° C. for about 20 hours.

After the polymerization reaction was completed, the reaction product was slowly precipitated in excess isopropyl alcohol (IPA) and filtered. The filtered precipitate was dissolved again in an appropriate amount of THF to then be reprecipitated in n-hexane. The obtained filtrate was dried in a vacuum oven maintained at 50° C. for about 24 hours to give a terpolymer having the above formula with a yield of 70%.

The resultant product had a weight average molecular weight (Mw) of 9,700 and a polydispersity (Mw/Mn) of 1.7.

EXAMPLE 4

Synthesis of Photosensitive Polymer

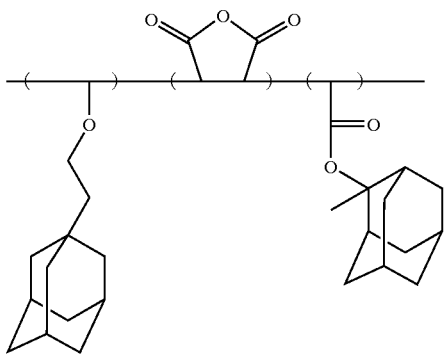

2.0 g (10 mmol) of the monomer synthesized in Example 1, 1.0 g (10 mmol) of maleic anhydride, 2.2 g (10 mmol) of 2-methyl-2-adamantyl acrylate and 0.15 g (3 mol %) AIBN were dissolved in 10 g of THF, and polymerized in the same manner as in Example 3, to give a terpolymer having the above formula with a yield of 68%.

The resultant product had a weight average molecular weight (Mw) of 10,700 and a polydispersity (Mw/Mn) of 1.9.

EXAMPLE 5

Synthesis of Photosensitive Polymer

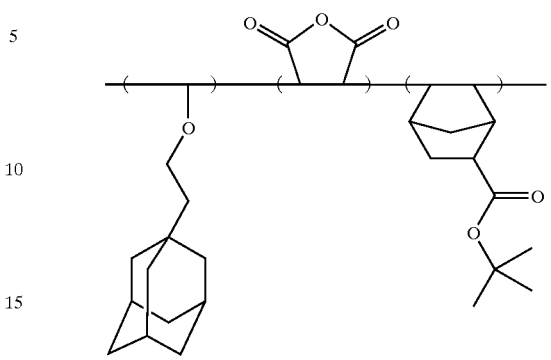

2.0 g (10 mmol) of the monomer synthesized in Example 1, 2.0 g (20 mmol) of maleic anhydride, 2.0 g (10 mmol) of 5-norbornene-2-carboxylate and 3 mol % AIBN were dissolved in 12 g of THF, and polymerized in the same manner as in Example 3, to give a terpolymer having the above formula with a yield of 55%.

The resultant product had a weight average molecular weight (Mw) of 8,600 and a polydispersity (Mw/Mn) of 1.9.

EXAMPLE 6

Synthesis of Photosensitive Polymer

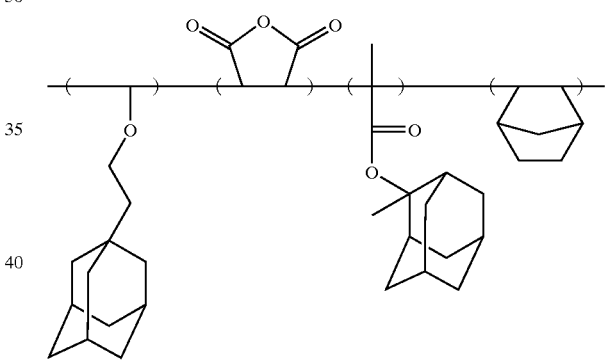

2.0 g (10 mmol) of the monomer synthesized in Example 1, 1.5 g (15 mmol) of maleic anhydride, 0.5 g (5 mmol) of norbornene, 3.5 g (15 mmol) of 2-methyl-2-adamantyl methacrylate and 3 mol % AIBN were dissolved in 15 g of THF, and polymerized in the same manner as in Example 3, to give a tetrapolymer having the above formula with a yield of 70%.

The resultant product had a weight average molecular weight (Mw) of 9,800 and a polydispersity (Mw/Mn) of 1.8.

EXAMPLE 7

Preparation of Resist Composition and Lithographic Performance

A method of preparing a resist composition according to embodiments of the present invention will now be described.

First, the photosensitive polymers synthesized in Examples 3 through 6 were dissolved in various types of solvents such as propylene glycol monomethyl ether acetate (PGMEA), ethyl lactate or cyclohexanone with a photoacid generator (PAG) to prepare a resist solution. If necessary, an organic base comprising amines may be added in an amount of approximately 0.01 to 2.0 wt % based on the amount of the PAG. Also, to adjust the overall dissolution speed of the resist, the resist composition may further include 5 to 25 wt % of a dissolution inhibitor, based on the weight of the photosensitive polymer.

The PAG is preferably contained in an amount of 1 to 15% by weight based on the weight of the photosensitive polymer. As the PAG, inorganic onium salts or organic onium salts may be used each alone or in combinations of two or more thereof. Examples of the PAG include triarylsulfonium triflate, diaryliodonium triflate, triarylsulfonium nonaflate, diaryliodonium nonaflate, succinimidyl triflate, 2,6-dinitrobenzyl sulfonate, and the like.

For a lithography process, the resist solution is first filtered twice using a 0.2 $\mu$m membrane filter to thus obtain a resist composition.

The obtained resist composition is subjected to the following processes to obtain a pattern.

A bare silicon wafer or a silicon wafer having an underlying layer, such as a silicon oxide layer, silicon nitride layer or silicon oxynitride layer, to be patterned thereon is prepared and treated with hexamethyldisilazane (HMDS). Thereafter, the silicon wafer layer is coated with the resist composition to a thickness of approximately 0.3 $\mu$m to form a resist layer.

The silicon wafer having the resist layer is pre-baked at a temperature in the range of 120 to 140° C., for approximately 60 to 90 seconds to remove a solvent, followed by exposure using various types of exposure light sources, e.g., deep UV (KrF or ArF), extreme UV (EUV), E-beam or X-ray. Next, in order to induce a chemical reaction at an exposed portion of the resist layer, post-exposure baking (PEB) is performed at a temperature in the range of 110 to 140° C. for approximately 60 to 90 seconds.

As a result, the exposed portion exhibits very high solubility to a developing solution including 2.38 wt % tetramethylammonium hydroxide (TMAH). Thus, during development, the exposed portion is dissolved well for removal. In the case where an ArF excimer laser is used, a 120 to 140 nm line and space pattern can be formed at an exposure dose of approximately 8 to 25 mJ/cm$^2$.

The underlying layer, such as a silicon oxide film, to be patterned is etched by a special etching gas, such as plasma, e.g., a halogen or $C_xF_y$ gas, using the resultant resist pattern as a mask. Subsequently, the resist pattern remaining on the wafer is removed by ashing and a wet process using a stripper, thereby forming a desired silicon oxide pattern.

Table 1 illustrates the results of a lithographic performance evaluation of the resist compositions according to embodiments of the present invention.

For the evaluation shown in Table 1, 1 g of each of the photosensitive polymers synthesized in Examples 3 through 6, and triphenyisulfonium(TPS) triflate, TPS nonaflate or a mixture thereof as a PAG were dissolved in 8 g of cyclohexane, and 2 mg of triisooctylamine as an organic base or triisobutylamine was added thereto for complete dissolution. Thereafter, a resist solution was filtered using a 0.2 $\mu$m membrane filter to give a resist composition.

A silicon (Si) wafer treated with an anti-reflective coating was coated with the obtained resist composition to a thickness of approximately 0.3 $\mu$m.

Thereafter, the coated wafer was subjected to soft baking (SB) under temperature and time conditions listed in Table 1, and exposed using an ArF excimer laser stepper (NA=0.6, $\sigma$=0.75), followed by performing post-exposure baking (PEB) under temperature and time conditions listed in Table 1. Next, development was performed using 2.38% by weight of a tetramethylammonium hydroxide (TMAH) solution for approximately 60 seconds to form a resist pattern. Resolution characteristics of the resist patterns are shown in Table 1.

Referring to Table 1, triisooctylamine was used as the organic base in Example 7-1, while triisobutylamine was used as the organic base in Examples 7-2 through 7-8.

TABLE 1

| Examples | Polymer | PAG | SB | PEB | Dose (mJ/cm$^2$) | Resolution (nm) |
|---|---|---|---|---|---|---|
| EX. 7-1 | EX. 3 (1 g) | TPS triflate (5 mg) TPS nonaflate (10 mg) | 120° C./ 90 sec | 120° C./ 60 sec | 15 | 140 |
| EX. 7-2 | EX. 3 (1 g) | TPS triflate (5 mg) TPS nonaflate (10 mg) | 120° C./ 90 sec | 120° C./ 60 sec | 17 | 120 |
| EX. 7-3 | EX. 3 (1 g) | TPS triflate (5 mg) TPS nonaflate (10 mg) | 120° C./ 90 sec | 130° C./ 60 sec | 16 | 120 |
| EX. 7-4 | EX. 3 (1 g) | TPS nonaflate (20 mg) | 120° C./ 90 sec | 120° C./ 90 sec | 17 | 120 |
| EX. 7-5 | EX. 3 (1 g) | TPS triflate (5 mg) TPS nonaflate (10 mg) | 120° C./ 90 sec | 120° C./ 90 sec | 11 | 130 |
| EX. 7-6 | EX. 4 (1 g) | TPS triflate (5 mg) TPS nonaflate (10 mg) | 120° C./ 90 sec | 130° C./ 90 sec | 13 | 140 |
| EX. 7-7 | EX. 5 (1 g) | TPS nonaflate (15 mg) | 120° C./ 90 sec | 130° C./ 90 sec | 18 | 140 |
| EX. 7-8 | EX. 6 (1 g) | TPS triflate (5 mg) TPS nonaflate (10 mg) | 120° C./ 90 sec | 120° C./ 90 sec | 16 | 120 |

As shown in Table 1, in each Example, a 120 to 140 nm, clean line and space pattern was obtained at a dose of 11 to 17 mJ/cm$^2$.

The photosensitive polymers according to embodiments of the present invention are obtained from a vinyl ether compound capable of easily forming an alternating copolymer in polymerization with an electron withdrawing monomer, e.g., maleic anhydride. In particular, the photosensitive polymers include an adamantylalkyl vinyl ether as a main component of its backbone. The adamantylalkyl vinyl ether monomer is a compound having a $C_1$–$C_4$ linear methylene group. The resist compositions obtained from the photosensitive polymers exhibit improved resistance to dry etching when compared to conventional resist materials, and provide good adhesion to underlying layer materials.

Also, an alkyl chain in the adamantylalkyl vinyl ether monomer included in the photosensitive polymer according to the present invention provides flexibility to the photosensitive polymer. Thus, the backbone of the photosensitive polymer is flexible, thereby having a relatively low glass transition temperature. Thus, it is possible to achieve a sufficient annealing effect for eliminating a free volume from the resist layer formed of the photosensitive polymer during baking. Accordingly, the resist layer has enhanced environmental resistance even at post-exposure delay (PED). Therefore, the resist compositions according to the embodiments of the present invention exhibit excellent lithographic performance characteristics when used in a photolithography process, which is advantageous in manufacturing next-generation semiconductor devices.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A photosensitive polymer comprising a copolymer having a formula:

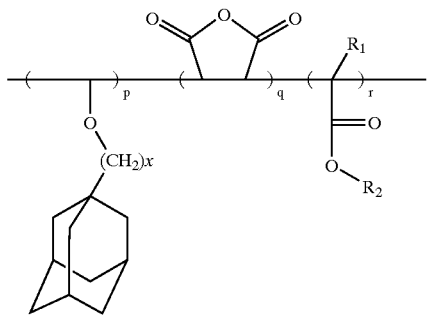

wherein x is an integer between 1 and 4 inclusive, $R_1$ is a hydrogen atom or a methyl group, $R_2$ is an acid-labile $C_4$ to $C_{20}$ hydrocarbon group, $p/(p+q+r)=0.1$ to 0.4, $q/(p+q+r)=0.1$ to 0.5, and $r/(p+q+r)=0.1$ to 0.4.

2. The photosensitive polymer of claim 1, wherein the polymer has a weight average molecular weight of 3,000 to 50,000.

3. The photosensitive polymer of claim 1, wherein $R_2$ is a t-butyl, tetrahydropyranyl or 1-ethoxyethyl group.

4. The photosensitive polymer of claim 1, wherein $R_2$ is an alicyclic hydrocarbon group.

5. The photosensitive polymer of claim 4, wherein $R_2$ is a 2-methyl-2-norbornyl, 2-ethyl-2-norbonyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 2-propyl-2-adamantyl, 2-methyl-2-fenchyl or 2-ethyl-2-fenchyl group.

6. A photosensitive polymer comprising a copolymer having a formula:

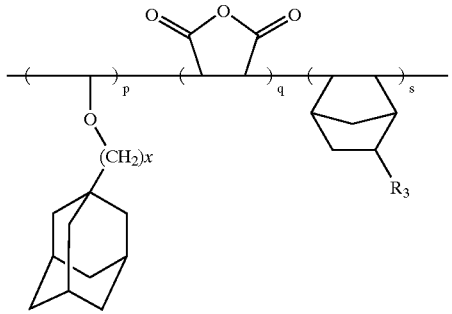

wherein x is an integer between 1 and 4 inclusive, $R_3$ is a hydrogen atom, or a hydroxy, carboxyl, halide, nitrile, alkyl, alkoxy, sulfonate or acid-labile $C_4$~$C_{20}$ ester group, $p/(p+q+s)=0.1$~$0.4$, $q/(p+q+s)=0.3$~$0.5$, and $s/(p+q+s)=0.2$~$0.5$.

7. The photosensitive polymer of claim 6, wherein the polymer has a weight average molecular weight of 3,000 to 30,000.

8. The photosensitive polymer of claim 6, wherein $R_3$ is a t-butyl ester, tetrahydropyranyl ester or 1-ethoxyethyl ester group.

9. The photosensitive polymer of claim 6, wherein $R_3$ is a 2-methyl-2-norbornyl ester, 2-ethyl-2-norbonyl ester, 2-methyl-2-isobornyl ester, 2-ethyl-2-isobornyl ester, 8-methyl-8-tricyclo[5.2.1.0$^{2,6}$]decanyl ester, 8-ethyl-8-tricyclo[5.2.1.0$^{2,6}$]decanyl ester, 2-methyl-2-adamantyl ester, 2-ethyl-2-adamantyl ester, 2-propyl-2-adamantyl ester, 2-methyl-2-fenchyl ester or 2-ethyl-2-fenchyl ester group.

10. A photosensitive polymer comprising a copolymer having a formula:

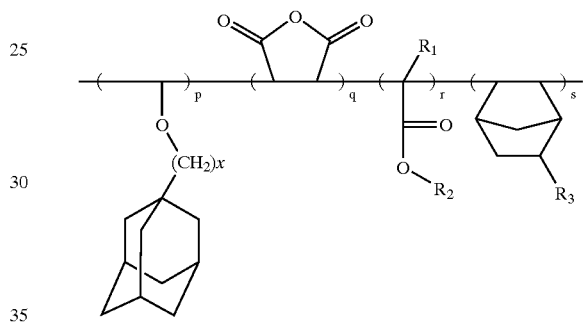

wherein x is an integer between 1 and 4 inclusive, $R_1$ is a hydrogen atom or a methyl group, $R_2$ is a $C_4$ to $C_{20}$ hydrocarbon group, $R_3$ is a hydrogen atom, or a hydroxy, carboxyl, halide, nitrile, alkyl, alkoxy, sulfonate or $C_4$ to $C_{20}$ ester group, at least one of $R_2$ and $R_3$ is an acid-labile group, $p/(p+q+r+s)=0.1$ to 0.3, $q/(p+q+r+s)=0.2$ to 0.5, $r/(p+q+r+s)=0.1$ to 0.4, and $s/(p+q+r+s)=0.1$ to 0.3.

11. The photosensitive polymer of claim 10, wherein the polymer has a weight average molecular weight of 3,000 to 30,000.

12. The photosensitive polymer of claim 10, wherein $R_2$ is a t-butyl, tetrahydropyranyl or 1-ethoxyethyl group.

13. The photosensitive polymer of claim 10, wherein $R_2$ is a 2-methyl-2-norbornyl, 2-ethyl-2-norbonyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 2-propyl-2-adamantyl, 2-methyl-2-fenchyl or 2-ethyl-2-fenchyl group.

14. The photosensitive polymer of claim 10, wherein $R_3$ is a t-butyl ester, tetrahydropyranyl ester or 1-ethoxyethyl ester group.

15. The photosensitive polymer of claim 10, wherein $R_3$ is a 2-methyl-2-norbornyl ester, 2-ethyl-2-norbonyl ester, 2-methyl-2-isobornyl ester, 2-ethyl-2-isobornyl ester, 8-methyl-8-tricyclo[5.2.1.0$^{2,6}$]decanyl ester, 8-ethyl-8-tricyclo[5.2.1.0$^{2,6}$]decanyl ester, 2-methyl-2-adamantyl ester, 2-ethyl-2-adamantyl ester, 2-propyl-2-adamantyl ester, 2-methyl-2-fenchyl ester or 2-ethyl-2-fenchyl ester group.

16. A resist composition comprising:
(a) a photosensitive polymer having a formula:

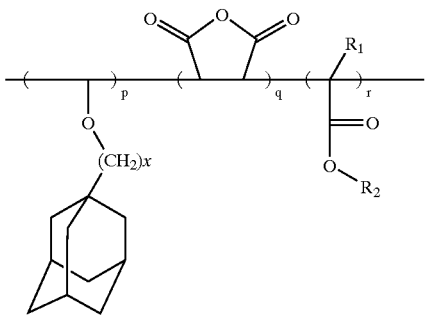

wherein x is an integer between 1 and 4 inclusive, $R_1$ is a hydrogen atom or a methyl group, $R_2$ is an acid-labile $C_4$ to $C_{20}$ hydrocarbon group, $p/(p+q+r)=0.1$ to 0.4, $q/(p+q+r)=0.1$ to 0.5, and $r/(p+q+r)=0.1$ to 0.4; and (b) a photoacid generator (PAG).

17. The resist composition of claim 16, wherein the photosensitive polymer has a weight average molecular weight of 3,000 to 50,000.

18. The resist composition of claim 16, wherein $R_2$ is a t-butyl, tetrahydropyranyl or 1-ethoxyethyl group.

19. The resist composition of claim 16, wherein $R_2$ is a 2-methyl-2-norbornyl, 2-ethyl-2-norbonyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 2-propyl-2-adamantyl, 2-methyl-2-fenchyl or 2-ethyl-2-fenchyl group.

20. The resist composition of claim 16, wherein the PAG is contained in an amount of about 1.0–15 wt % based on the total weight of the photosensitive polymer.

21. The resist composition of claim 16, wherein the PAG comprises triarylsulfonium salts, diaryliodonium salts, sulfonates or a mixture of at least two of these compounds.

22. The resist composition of claim 16, further comprising an organic base.

23. The resist composition of claim 22, wherein the organic base is contained in an amount of about 0.01–2.0 wt % based on the amount of the PAG.

24. The resist composition of claim 22, wherein the organic base comprises triethylamine, triisobutylamine, triisooctylamine, triisodecylamine, triethanolamine, or a mixture of at least two of these compounds.

25. A resist composition comprising:
(a) a photosensitive polymer comprising a copolymer having a formula:

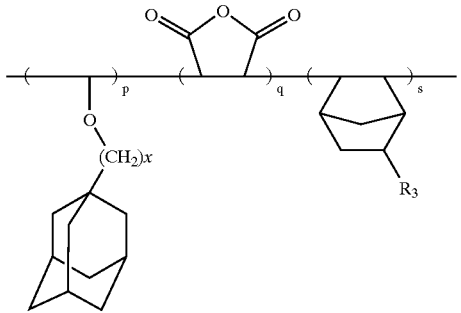

wherein x is an integer between 1 and 4 inclusive, $R_3$ is a hydrogen atom, or a hydroxy, carboxyl, halide, nitrile, alkyl, alkoxy, sulfonate or acid-labile $C_4$ to $C_{20}$ ester group, $p/(p+q+s)=0.1$ to 0.4, $q/(p+q+s)=0.3$ to 0.5, and $s/(p+q+s)=0.2$ to 0.5; and (b) a photoacid generator (PAG).

26. The resist composition of claim 25, wherein the polymer has a weight average molecular weight of 3,000 to 30,000.

27. The resist composition of claim 25, wherein $R_3$ is a t-butyl ester, tetrahydropyranyl ester or 1-ethoxyethyl ester group.

28. The resist composition of claim 25, wherein $R_3$ is a 2-methyl-2-norbornyl ester, 2-ethyl-2-norbonyl ester, 2-methyl-2-isobornyl ester, 2-ethyl-2-isobornyl ester, 8-methyl-8-tricyclo[5.2.1.0$^{2,6}$]decanyl ester, 8-ethyl-8-tricyclo[5.2.1.0$^{2,6}$]decanyl ester, 2-methyl-2-adamantyl ester, 2-ethyl-2-adamantyl ester, 2-propyl-2-adamantyl ester, 2-methyl-2-fenchyl ester or 2-ethyl-2-fenchyl ester group.

29. The resist composition of claim 25, wherein the PAG is contained in an amount of about 1.0–15 wt % based on the total weight of the photosensitive polymer.

30. The resist composition of claim 25, wherein the PAG comprises triarylsulfonium salts, diaryliodonium salts, sulfonates or a mixture of at least two of these compounds.

31. The resist composition of claim 25, further comprising an organic base.

32. The resist composition of claim 31, wherein the organic base is contained in an amount of about 0.01–2.0 wt % based on the amount of the PAG.

33. The resist composition of claim 31, wherein the organic base comprises triethylamine, triisobutylamine, triisooctylamine, triisodecylamine, triethanolamine, and a mixture of at least two of these compounds.

34. A resist composition comprising:
(a) a photosensitive polymer comprising a copolymer having a formula:

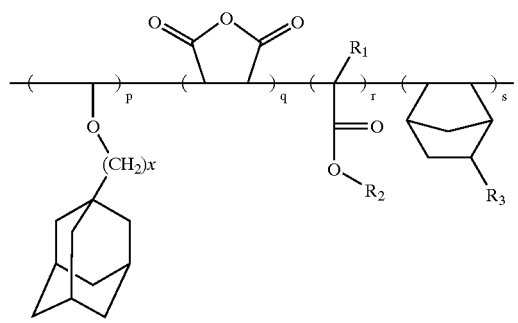

wherein x is an integer between 1 and 4 inclusive, $R_1$ is a hydrogen atom or a methyl group, $R_2$ is a $C_4$ to $C_{20}$ hydrocarbon group, $R_3$ is a hydrogen atom, or a hydroxy, carboxyl, halide, nitrile, alkyl, alkoxy, sulfonate or $C_4$ to $C_{20}$ ester group, at least one of $R_2$ and $R_3$ is an acid-labile group, $p/(p+q+r+s)=0.1$ to 0.3, $q/(p+q+r+s)=0.2$ to 0.5, $r/(p+q+r+s)=0.1$ to 0.4, and $s/(p+q+r+s)=0.1$ to 0.3; and (b) a photoacid generator (PAG).

35. The resist composition of claim 34, wherein the polymer has a weight average molecular weight of 3,000 to 30,000.

36. The resist composition of claim 34, wherein $R_2$ is a t-butyl, tetrahydropyranyl or 1-ethoxyethyl group.

37. The resist composition of claim 34, wherein $R_2$ is a 2-methyl-2-norbornyl, 2-ethyl-2-norbonyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 2-propyl-2-adamantyl, 2-methyl-2-fenchyl or 2-ethyl-2-fenchyl group.

38. The resist composition of claim 34, wherein $R_3$ is a t-butyl ester, tetrahydropyranyl ester or 1-ethoxyethyl ester.

39. The resist composition of claim 34, wherein $R_3$ is a 2-methyl-2-norbornyl ester, 2-ethyl-2-norbonyl ester, 2-methyl-2-isobornyl ester, 2-ethyl-2-isobornyl ester, 8-methyl-8-tricyclo[5.2.1.0$^{2,6}$]decanyl ester, 8-ethyl-8-tricyclo[5.2.1.0$^{2,6}$]decanyl ester, 2-methyl-2-adamantyl ester, 2-ethyl-2-adamantyl ester, 2-propyl-2-adamantyl ester, 2-methyl-2-fenchyl ester or 2-ethyl-2-fenchyl ester group.

40. The resist composition of claim 34, wherein the PAG is contained in an amount of about 1.0–15 wt % based on the total weight of the photosensitive polymer.

41. The resist composition of claim 34, wherein the PAG comprises triarylsulfonium salts, diaryliodonium salts, sulfonates or a mixture of at least two of these compounds.

42. The resist composition of claim 34, further comprising an organic base.

43. The resist composition of claim 42, wherein the organic base is contained in an amount of about 0.01–2.0 wt % based on the amount of the PAG.

44. The resist composition of claim 42, wherein the organic base comprises triethylamine, triisobutylamine, triisooctylamine, triisodecylamine, triethanolamine, and a mixture of at least two of these compounds.

* * * * *